United States Patent
Neumann et al.

(10) Patent No.: US 12,538,516 B2
(45) Date of Patent: Jan. 27, 2026

(54) FORKSHEET TRANSISTOR WITH ASYMMETRIC DIELECTRIC SPINE

(71) Applicant: Intel Corporation, Santa Clara, CA (US)

(72) Inventors: Christopher M. Neumann, Portland, OR (US); Ashish Agrawal, Hillsboro, OR (US); Seung Hoon Sung, Portland, OR (US); Marko Radosavljevic, Portland, OR (US); Jack T. Kavalieros, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 946 days.

(21) Appl. No.: 17/509,223

(22) Filed: Oct. 25, 2021

(65) Prior Publication Data

US 2023/0126135 A1    Apr. 27, 2023

(51) Int. Cl.
*H10D 30/62*    (2025.01)
*H10D 30/01*    (2025.01)
*H10D 62/10*    (2025.01)
*H10D 84/83*    (2025.01)

(52) U.S. Cl.
CPC ......... *H10D 30/62* (2025.01); *H10D 30/024* (2025.01); *H10D 62/119* (2025.01); *H10D 84/834* (2025.01); *H10D 30/6219* (2025.01)

(58) Field of Classification Search
CPC .... H10D 30/62; H10D 30/024; H10D 84/834; H10D 62/121; H10D 84/0188; H10D 84/85

See application file for complete search history.

(56) References Cited

U.S. PATENT DOCUMENTS

| | | | |
|---|---|---|---|
| 10,263,100 B1 * | 4/2019 | Bi | H10D 62/364 |
| 11,239,236 B2 * | 2/2022 | Lilak | H10D 84/856 |

(Continued)

FOREIGN PATENT DOCUMENTS

EP    3886145 A1 *    9/2021    ............. H10D 64/01

OTHER PUBLICATIONS

Extended European Search Report received for EP application No. 22184940.9, dated Jan. 2, 2023. 14 pages.

(Continued)

*Primary Examiner* — Bac H Au
(74) *Attorney, Agent, or Firm* — Finch & Maloney PLLC

(57) ABSTRACT

Techniques are provided herein to form a forksheet transistor device with a dielectric overhang structure. The dielectric overhang structure includes a dielectric layer that at least partially hangs over the nanoribbons of each semiconductor device in the forksheet transistor and is directly coupled to, or is an integral part of, the dielectric spine between the semiconductor devices. The overhang structure allows for a higher alignment tolerance when forming different work function metals over each of the different semiconductor devices, which in turn allows for narrower dielectric spines to be used. A first gate structure that includes a first work function metal may be formed around the nanoribbons of the n-channel device and a second gate structure that includes a second work function metal may be formed around the nanoribbons of the p-channel device in the forksheet arrangement.

15 Claims, 11 Drawing Sheets

(56) References Cited

U.S. PATENT DOCUMENTS

| | | | |
|---|---|---|---|
| 11,664,377 B2* | 5/2023 | Lilak | H10D 30/43 |
| | | | 257/499 |
| 11,923,370 B2* | 3/2024 | Sung | H10D 86/201 |
| 12,243,875 B2* | 3/2025 | Sung | H10D 30/6757 |
| 2019/0355845 A1* | 11/2019 | Zhou | H10D 30/6729 |
| 2020/0035567 A1 | 1/2020 | Chanemougame et al. | |
| 2021/0082766 A1 | 3/2021 | Miura et al. | |
| 2021/0296315 A1 | 9/2021 | Lilak et al. | |
| 2021/0305430 A1 | 9/2021 | Guler et al. | |
| 2021/0407999 A1* | 12/2021 | Huang | H10D 84/85 |
| 2021/0408009 A1* | 12/2021 | Zheng | H10D 84/0167 |
| 2023/0066979 A1* | 3/2023 | Frougier | H10D 62/121 |
| 2023/0163168 A1* | 5/2023 | Agrawal | H10D 84/038 |
| | | | 257/401 |
| 2024/0204064 A1* | 6/2024 | Bouche | H10D 84/0167 |
| 2024/0213250 A1* | 6/2024 | Koh | H10D 84/853 |

OTHER PUBLICATIONS

Na, et al., "Disruptive Technology Elements, and Rapid and Accurate Block-Level Performance Evaluation for 3nm and Beyond," Electron Devices Technology and Manufacturing Conference, 2021. 3 pages.

* cited by examiner

FORKSHEET TRANSISTOR WITH ASYMMETRIC DIELECTRIC SPINE

FIELD OF THE DISCLOSURE

The present disclosure relates to integrated circuits, and more particularly, to the fabrication of forksheet transistor devices.

BACKGROUND

As integrated circuits continue to scale downward in size, a number of challenges arise. For instance, reducing the size of memory and logic cells or otherwise increasing device density is becoming increasingly more difficult. As transistor devices are spaced closer together to maximize device density on the chip, certain fabrication procedures become challenging. Many of these challenges are related to constraints imposed by alignment tolerances in current lithography technology.

Figure 1A:
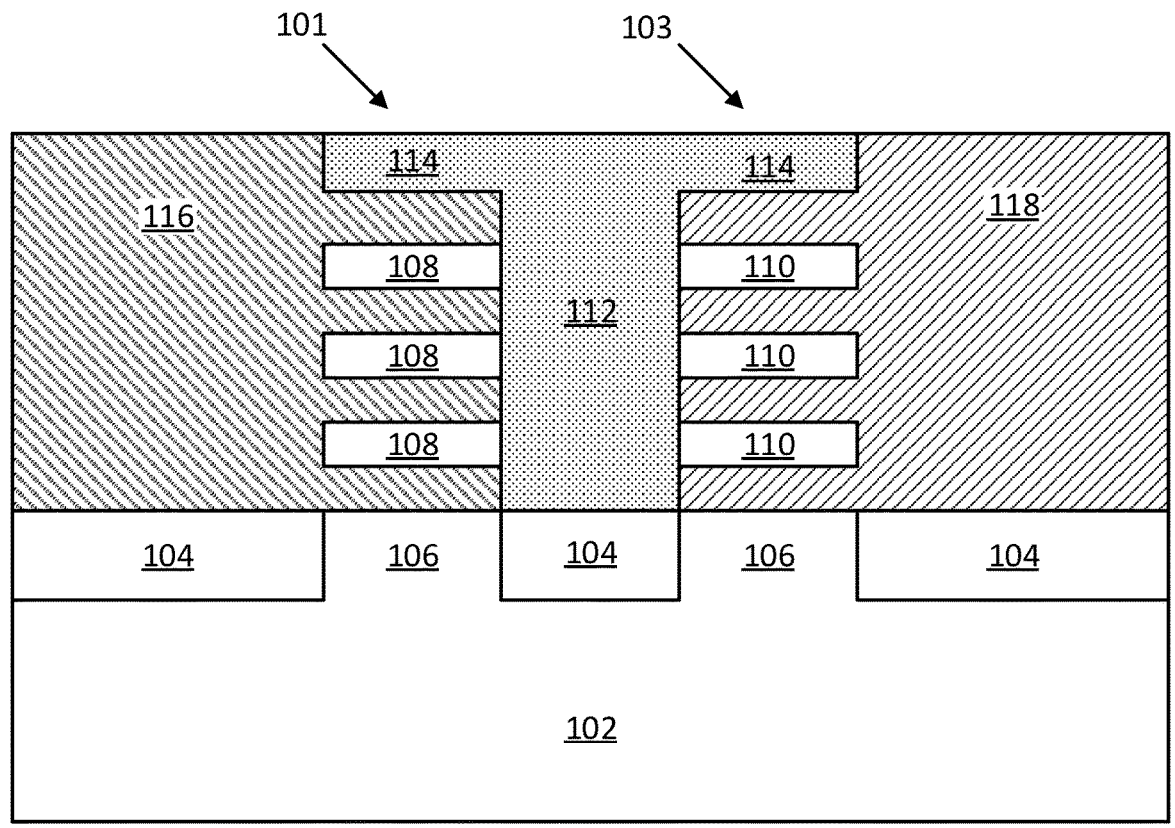
FIG. 1A is a cross-sectional view of an example integrated circuit having a semiconductor device with a dielectric overhang structure, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may be tapered and/or have rounded corners), and some features may have surface topology or otherwise be non-smooth, given real world limitations of the processing equipment and techniques used.

DETAILED DESCRIPTION

Techniques are provided herein to form a forksheet transistor device with a dielectric overhang structure. According to some embodiments, the dielectric overhang structure includes a dielectric layer that at least partially hangs over the nanoribbons of each semiconductor device in the forksheet transistor and is directly coupled to, or is an integral part of, the dielectric spine between the semiconductor devices. The overhang structure allows for a higher alignment tolerance when forming different work function metals over each of the different semiconductor devices, which in turn allows for narrower dielectric spines to be used. The techniques can be used in any number of integrated circuit applications and are particularly useful with respect to high-density transistor areas on a die such as logic and memory cells, such as those cells that use gate-all-around (GAA) transistors in a forksheet arrangement. In one example, two different semiconductor devices of a given memory or logic cell, such as a synchronous random access memory (SRAM) cell or a complementary metal oxide semiconductor (CMOS) cell, include a p-channel device and an n-channel device. More specifically, the n-channel device and the p-channel device may both be GAA transistors each having any number of nanoribbons (e.g., 1 to 4, or more) extending in the same direction where the n-channel device is located adjacent to the p-channel with a dielectric spine extending vertically between the two devices, such that the nanoribbons appear to be cantilevered off the spine. The top of the dielectric spine extends outward in a 'T' shape at least partially over each of the semiconductor devices. A first gate structure that includes a first work function metal may be formed around the nanoribbons of the n-channel device and a second gate structure that includes a second work function metal may be formed around the nanoribbons of the p-channel device. Numerous variations and embodiments will be apparent in light of this disclosure.

General Overview

As previously noted above, there remain a number of non-trivial challenges with respect to designing forksheet transistors. The minimum spacing between adjacent n-channel and p-channel devices (e.g., the width of the dielectric spine between the devices) is limited by the edge placement error (EPE) of the lithography process. If the lithography process is misaligned, then the gate structures will be formed incorrectly, and the transistors will not function properly. Standard processing calls for the width of the dielectric spine between the devices to be at least two times (2×) wider than the acceptable EPE, which limits increasing transistor density on the die.

Thus, and in accordance with an embodiment of the present disclosure, techniques are provided herein to decouple the EPE from the width of the dielectric spine. According to some embodiments, a dielectric overhang structure is formed as either an integral part of the dielectric spine or coupled directly to a top portion of the dielectric spine between adjacent semiconductor devices in a forksheet arrangement. The overhang structure effectively increases the width of the spine providing a higher EPE during lithography without increasing the width of the entire spine. According to some embodiments, the overhang structure and dielectric spine together form a dielectric 'T' structure that extends vertically between the adjacent semiconductor devices. One of the semiconductor devices may be an n-channel device while the other semiconductor device is a p-channel device. In other such example embodiments, both of the semiconductor devices can be of the same polarity.

Although description herein focuses on the use of GAA transistor configurations for the semiconductor devices, the techniques can be applied to other channel configurations as well, such as trigate transistors.

According to an embodiment, an integrated circuit includes a first semiconductor device having a first semiconductor material extending in a first direction between a first source region and a first drain region, a second semiconductor device extending in the first direction between a second source region and a second drain region, a dielectric spine between the first semiconductor material and the second semiconductor material, and an overhang structure comprising a dielectric material. The dielectric spine contacts both the first semiconductor material and the second semiconductor material. The overhang structure is at least partially over both the first semiconductor material and the second semiconductor material and either contacts or is an integral part of the dielectric spine. The integrated circuit also includes a first gate structure around the first semiconductor material and a second gate structure around the second semiconductor material. Note the gate structures may be gate-all-around structures or tri-gate structures or double-gate structures, depending on the channel configuration.

According to another embodiment, a method of forming an integrated circuit includes forming a first fin comprising first semiconductor material and a second fin comprising second semiconductor material, wherein the first fin and the second fin extend parallel to one another; forming a dielectric structure between the first fin and the second fin; forming a sacrificial gate over the first fin and the second fin; forming spacer structures on sidewalls of the sacrificial gate; forming source and drain regions at ends of both the first fin and the second fin; removing the sacrificial gate; forming a first gate structure over the first semiconductor material; and forming a second gate structure over the second semiconductor material. Forming the dielectric structure includes forming a dielectric spine between the first fin and the second fin, such that the dielectric spine contacts both the first fin and the second fin, and forming an overhang structure over at least partially both the first fin and the second fin, the overhang structure either contacting or being an integral part of the dielectric spine.

The techniques are especially suited for use with gate-all-around transistors such as nanowire and nanoribbon transistors in a forksheet arrangement but may also be applicable in some instances to finFET or other transistor devices that have laterally adjacent channel regions separated by a dielectric structure. The source and drain regions can be, for example, doped portions of a semiconductor body that includes the channel region, or epitaxial regions that are deposited adjacent the channel region during an etch-and-replace source/drain forming process. The dopant-type in the source and drain regions will depend on the polarity of the corresponding transistor. The gate electrode can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools can be used to image or otherwise indicate a dielectric spine that is between two laterally adjacent semiconductor devices and has a wider top portion. The wider top portion may extend at least partially over the semiconductor channel regions of the adjacent semiconductor devices. The dielectric material of the spine may be the same or different than the dielectric material of the wider top portion, which may include arms that extend laterally from the spine out over the semiconductor channel regions. In some embodiments, the overhang structure may be partially or fully polished away, in which case the earlier existence of the overhang structure may be indicated by way of a partial overhand structure and/or an additional metal work function layer that remains above the top semiconductor nanoribbons in the semiconductor devices.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

Figure 1B:
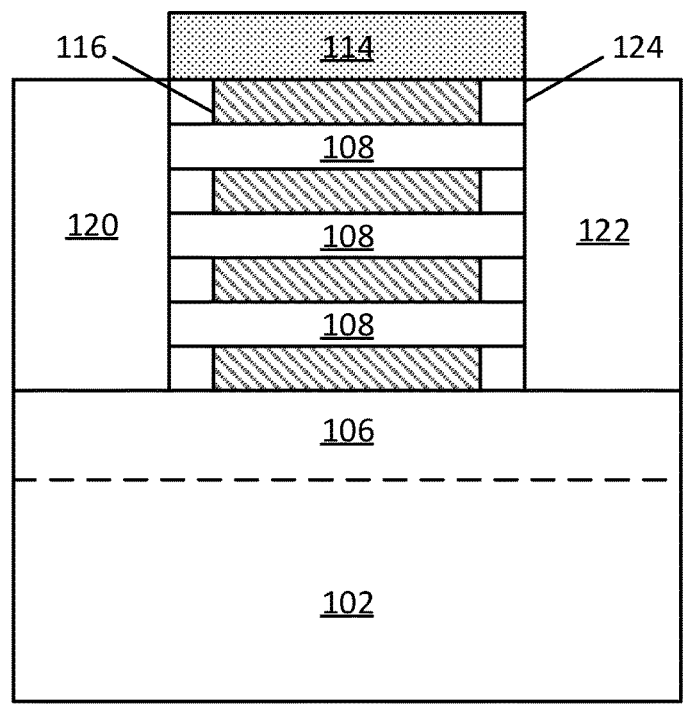
FIG. 1B is an orthogonal cross-sectional view of the semiconductor device in FIG. 1A, in accordance with an embodiment of the present disclosure.

FIG. 1A is a cross sectional view of a portion of an integrated circuit that includes a first semiconductor device 101 and a second semiconductor device 103 adjacent to one another in a forksheet arrangement. Each of semiconductor devices 101 and 103 may be non-planar metal oxide semiconductor (MOS) transistors, such as tri-gate or gate-all-around (GAA) transistors, although other transistor topologies and types could also benefit from the techniques provided herein. The illustrated embodiments herein use the GAA structure. Semiconductor devices 101 and 103 represent a portion of an integrated circuit that may contain any number of similar semiconductor devices. The cross-section view in FIG. 1A is taken across first semiconductor device 101 and second semiconductor device 103 in a first direction while FIG. 1B provides a cross-section view taken across first semiconductor device 101 in a second direction orthogonal to the first direction.

As can be seen, semiconductor devices 101 and 103 are formed on a substrate 102. Any number of semiconductor devices can be formed on or over substrate 102, but two are used here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

The semiconductor material in each of semiconductor devices 101 and 103 may be formed from substrate 102. Semiconductor devices 101 and 103 may each include fins or semiconductor material as nanowires or nanoribbons that can be, for example, native to substrate 102 (formed from the substrate itself). Alternatively, the fins or semiconductor material can be formed of material deposited onto an underlying substrate. In one such example case, a blanket layer of silicon germanium (SiGe) can be deposited onto a silicon substrate, and then patterned and etched to form a plurality of SiGe fins or nanoribbons. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches.

As can further be seen, adjacent semiconductor devices are separated by a dielectric layer 104 that may include silicon oxide. Dielectric layer 104 provides shallow trench isolation (STI) between any adjacent semiconductor devices. Dielectric layer 104 can be any suitable dielectric material, such as silicon dioxide, aluminum oxide, or silicon oxycarbonitride.

Focusing on first semiconductor device 101, but also applicable to second semiconductor device 103, first semiconductor device 101 includes a subfin region 106 and a semiconductor region that includes a plurality of nanoribbons 108 above the subfin region 106. According to some embodiments, subfin region 106 comprises the same semiconductor material as substrate 102 and is adjacent to dielectric layer 104. According to some embodiments, nanoribbons 108 extend between a source and a drain region to provide an active region for a transistor (e.g., the semiconductor region beneath the gate). The source and drain regions are not shown in the cross-section of FIG. 1A, but are seen in the cross-section view of FIG. 1B where nanoribbons 108 of first semiconductor device 101 extend between a source region 120 and a drain region 122 (similarly, the nanoribbons 110 of semiconductor device 103 extend between corresponding source and drain regions). FIG. 1B also illustrates spacer structures 124 on either end of nanoribbons 108. Spacer structures 124 may include a dielectric material, such as silicon nitride. In some examples, spacer structures 124 are provided during source/drain processing. For instance, in one example case, the multilayer structure that includes nanoribbons 108 is etched away in the source and drain regions (where 120 and 122 will subsequently be deposited). With the source and drain recesses open, sacrificial layers between the nanoribbons 108 can be selectively recessed in the lateral direction (e.g., by an isotropic etch within the source and drain recesses, the etch being selective to nanoribbons 108), and then spacer material conformally deposited (e.g., atomic layer deposition, ALD) within the recesses, so as to provide spacer structures 124 between layers 108. Any excess spacer material deposited within the recesses can be removed, for instance, via a directional etch (e.g., anisotropic dry etch) or an isotropic etch, so as to provide the example structure shown in FIG. 1B.

According to some embodiments, the source and drain regions are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, a dielectric spine 112 is provided between semiconductor devices 101 and 103. Dielectric spine 112 may be any suitable dielectric material, such as silicon dioxide, aluminum oxide, silicon nitride, or silicon oxycarbonitride. In some embodiments, dielectric spine 112 may include more than one material layer, such as one or more thin dielectric layers along the edges that contact nanoribbons 108 of first semiconductor device 101 and nanoribbons 110 of second semiconductor device 103. In general, dielectric spine 112 is in contact with both nanoribbons 108 of first semiconductor device 101 and nanoribbons 110 of second semiconductor device 103.

According to some embodiments, an overhang structure 114 extends at least partially over the top of nanoribbons 108 and 110. Overhang structure 114 may either be an integral part of dielectric spine 112, or it may be a different dielectric material. According to some embodiments, overhang structure 114 has a vertical thickness (in the y-axis) that is similar to a vertical thickness of each of nanoribbons 108 and 110. In one example, overhang structure 114 has a thickness between about 5 nm and about 20 nm. The lateral width (in the x-axis) of the overhang structure can vary from one embodiment to the next but in some cases is at least 1.5 times the lateral width of the dielectric spine or at least two times wider. The combination of dielectric spine 112 and overhang structure 114 provides a wider overall dielectric structure while also allowing a narrower dielectric spine 112. In some examples, dielectric spine 112 has a width between about 10 nm and about 20 nm, which is a narrower range compared to typical spine structures that do not use overhang structures 114 (which can also be thought of as a single continuous overhang structure 114, as will be appreciated). Example fabrication processes used to form the combination of dielectric spine 112 and overhang structure 114 are described in more detail herein with reference to FIGS. 2A-2I and FIGS. 3A-3B.

A first gate structure 116 is provided over each of nanoribbons 108 and a second gate structure 118 is provided over each of nanoribbons 110, according to some embodiments. Each of gate structures 116 and 118 includes both a gate dielectric around the corresponding nanoribbons and a gate electrode over the gate dielectric. The gate dielectric may include a single material layer or multiple material layers. In some embodiments, the gate dielectric includes a first dielectric layer such as silicon oxide and a second dielectric layer that includes a high-k material such as hafnium oxide. The hafnium oxide may be doped with an element to affect the threshold voltage of the given semiconductor device. In some embodiments, the gate dielectric used around nanoribbons 108 has a different element doping concentration compared to the gate dielectric around nanoribbons 110. According to some embodiments, the doping element used in the gate dielectric is lanthanum.

According to some embodiments, first gate structure 116 includes a first gate electrode that extends over the gate dielectric around each of nanoribbons 108 and second gate structure 118 includes a second gate electrode that extends over the gate dielectric around each of nanoribbons 110. Each of the gate electrodes may include any sufficiently conductive material such as a metal, metal alloy, or doped polysilicon. According to some embodiments, either gate electrode may be interrupted between any other semiconductor devices along the first direction by a gate cut structure. In some embodiments, each gate electrode includes one or more work function metals around the corresponding nanoribbons. In some embodiments, for instance, semiconductor device 101 is a p-channel device that includes n-type dopants within nanoribbons 108 and includes a work function metal having titanium around nanoribbons 108 and semiconductor device 103 is an n-channel device that includes p-type dopants within nanoribbons 110 and includes a work function metal having tungsten around nanoribbons 110. Each of the gate electrodes may also include a fill metal or other conductive material (e.g., tungsten, ruthenium, molybdenum, aluminum) around the work function metals to provide the whole gate electrode structure.

Figure 1C:
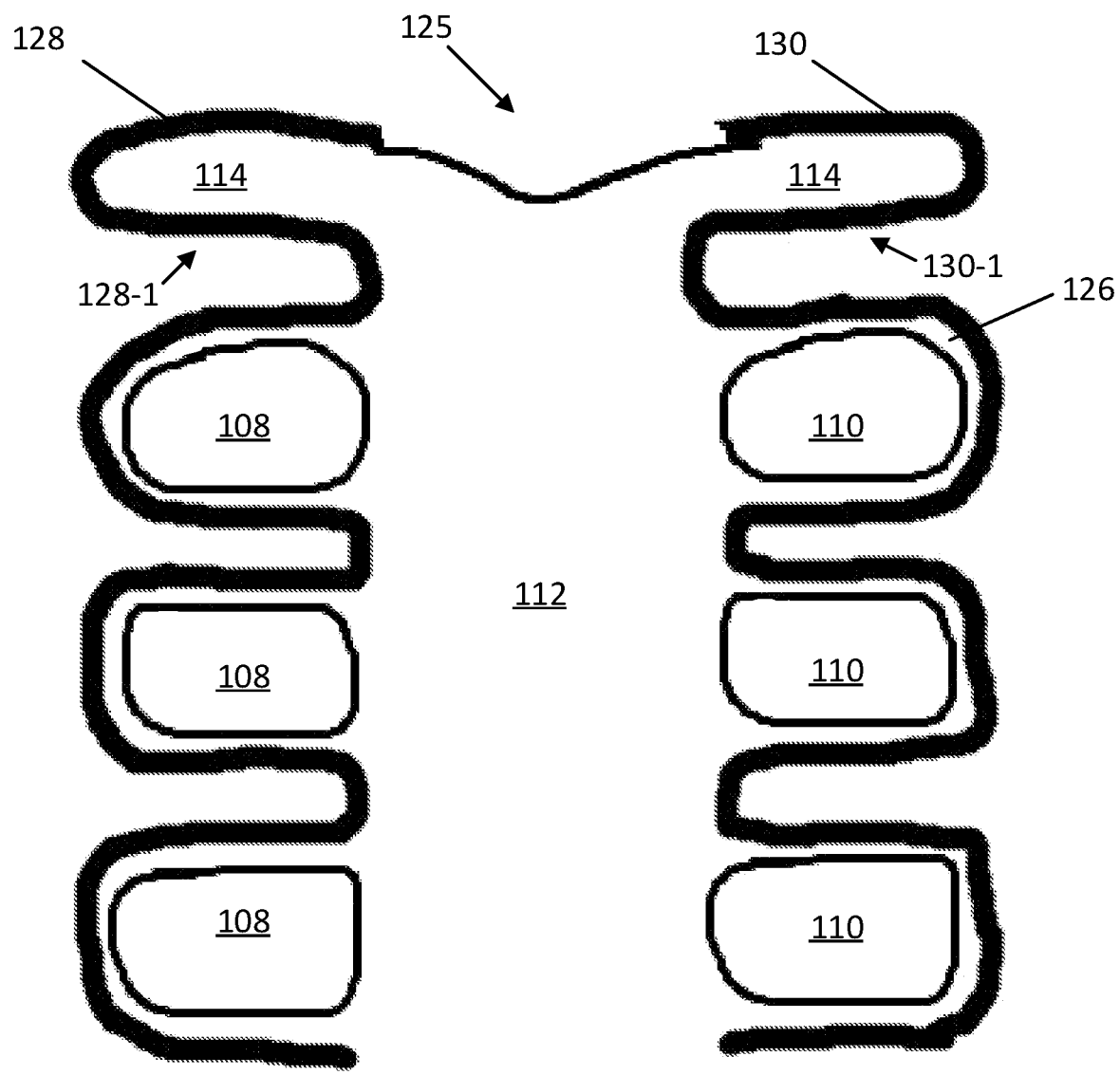
FIG. 1C is another cross-sectional view of a forksheet transistor with a dielectric overhang structure, in accordance with an embodiment of the present disclosure.

FIG. 1C illustrates a cross-section view taken across a forksheet transistor similar to that depicted in FIG. 1A, except that the various features are drawn to reflect real-world process conditions, according to an embodiment. For instance, while FIG. 1A generally indicates the various features using straight lines, right angles, and smooth surfaces, an actual integrated circuit structure configured in accordance with an embodiment of the present disclosure may have less than perfect straight lines and right angles, and some features may have a rough surface topography or otherwise be non-smooth, given real-world limitations of fabrication processes such as etching and depositing. As can be seen in FIG. 1C, the various nanoribbons 108 and 110 have a more rounded and blob-like cross-section. Similarly, overhang structures 114 may have a rounded and/or generally uneven or otherwise less than perfectly symmetrical profile.

According to some embodiments, a top surface of dielectric spine 112 has a dip 125. Dip 125 may be a product of the fabrication process used to form overhang structures 114, according to some embodiments of the present disclosure. A gate dielectric 126 is illustrated around each of nanoribbons 108 and 110 (e.g., a first layer of silicon dioxide on the nanoribbons, along with a second layer high high-k dielectric material such as hafnium oxide, or just a layer of high-k dielectric material). Additionally, a first work function metal 128 is formed around nanoribbons 108 while a second work function metal 130 is formed around nanoribbons 110. As discussed above, first and second work function metals 128 and 130 may have different material compositions. The work function metals are also formed along edges of overhang structures 114, according to some embodiments. In some cases, at least a portion of overhang structures 114 may be polished away (e.g., using a chemical mechanical polishing process) but portions of the work function metals may remain over the top nanoribbons of each semiconductor device, such as work function portions 128-1 and 130-1. Due to the lithographic patterning process according to this example embodiment, and as will be explained in turn, each of work function metals 128 and 130 do not extend along the entire top surface of dielectric spine 112 and overhang structures 114.

Fabrication Methodology

FIGS. 2A — 2I include cross-sectional views that collectively illustrate an example process for forming an integrated circuit configured with forksheet transistors having a dielectric overhang structure, in accordance with an embodiment of the present disclosure. Each figure shows an example structure that results from the process flow up to that point in time, so the depicted structure evolves as the process flow continues, culminating in the structure shown in FIG. 2I, which is similar to the structure illustrated in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
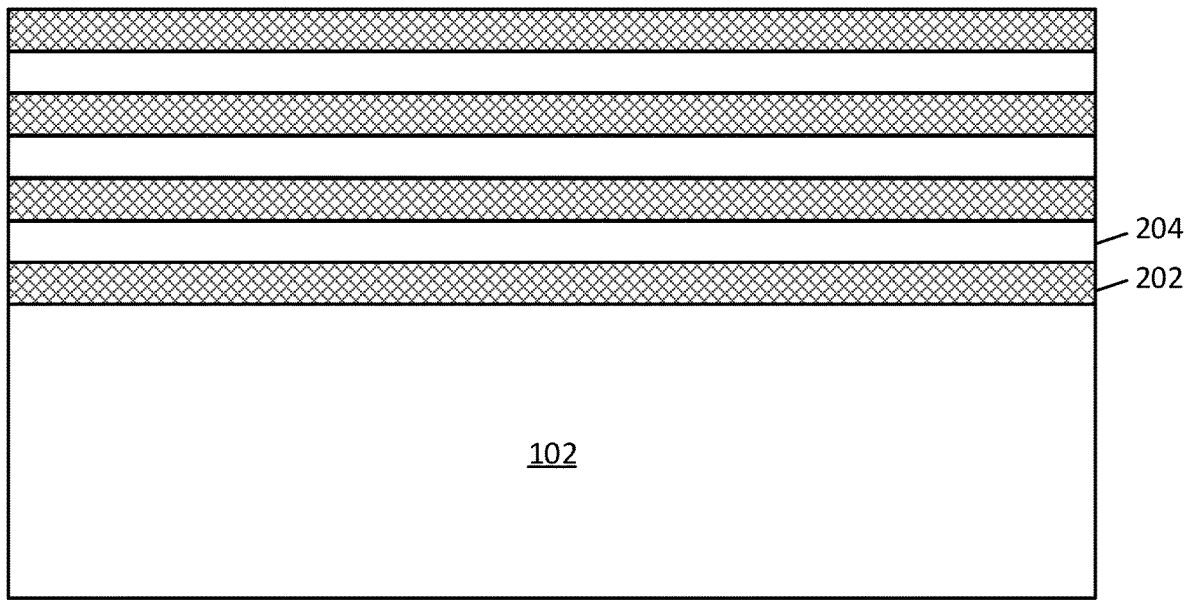
FIGS. 2A-2I are cross-sectional views that collectively illustrate an example process for forming a semiconductor device having a dielectric overhang structure, in accordance with an embodiment of the present disclosure.

FIG. 2A illustrates a cross-sectional view across a substrate having a series of material layers deposited over it, according to an embodiment of the present disclosure. The previous relevant discussion with respect to example configurations and materials for substrate 102 is equally applicable here. Alternating material layers may be deposited over substrate 102, including sacrificial layers 202 alternating with semiconductor layers 204. Any number of alternating sacrificial layers 202 and semiconductor layers 204 may be deposited over substrate 102. In some embodiments, sacrificial layers 202 are silicon germanium (SiGe) while each of semiconductor layers 204 includes a semiconductor material suitable for use as a nanoribbon such as silicon (Si), SiGe, germanium, or III-V materials like indium phosphide (InP) or gallium arsenide (GaAs).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm) as the thickness of each semiconductor layer 204. Each of sacrificial layers 202, and semiconductor layers 204 may be deposited using any known material deposition technique, such as chemical vapor deposition (CVD), plasma-enhanced chemical vapor deposition (PECVD), physical vapor deposition (PVD), or atomic layer deposition (ALD).

Figure 2B:
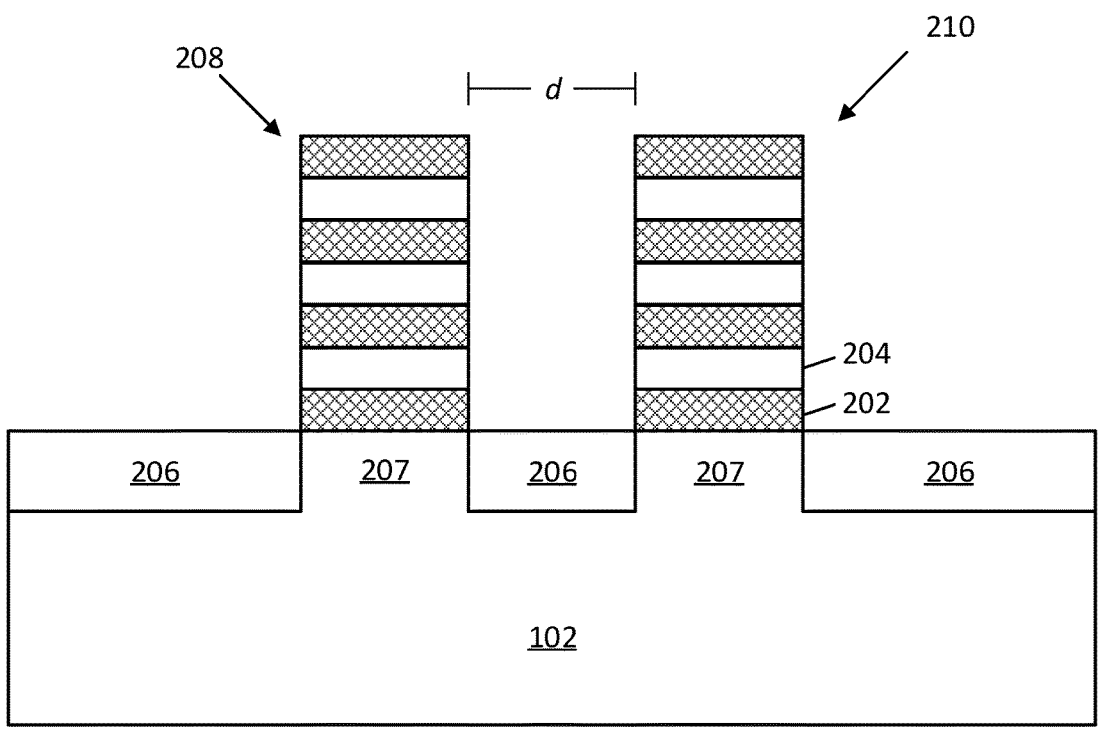

FIG. 2B illustrates a cross-sectional view of the structure shown in FIG. 2A following the formation of semiconductor fins, according to an embodiment. Any number of fins can be patterned across the integrated circuit, but only two (as part of a forksheet transistor) are illustrated here for clarity. Each of semiconductor device 208 and 210 includes a semiconductor fin. The fins can include at least a portion (e.g., subfin portion) that is native to the substrate, as illustrated, or may be non-native to the substrate. Each of the illustrated fins includes a multi-layer structure having alternating sacrificial layers 202 and semiconductor layers 204. In some embodiments, the fins are alternating with respect to transistor polarity. For instance, the fin of semiconductor device 208 can include a PMOS material fin (e.g., semiconductor layers 204 are doped with n-type dopants) and the fin of semiconductor device 210 can include an NMOS material fin (e.g., semiconductor layers 204 are doped with p-type dopants) for a first logic or memory cell. Numerous other configurations can be used, including fins included in integrated circuit sections other than memory or logic sections, such as analog mixed signal sections, input/output sections, radio frequency or transducer sections.

The fins may be formed by using a patterned hard mask layer or photoresist. According to some embodiments, the hard mask layer or photoresist protects the underlying material during a directional etching process, such as reactive ion etching (RIE). While dimensions can vary from one example embodiment to the next, the total height of the fins extending above the surface of substrate 102 may be in the range of about 100 nm to about 250 nm. The distance d between the adjacent fins of semiconductor devices 208 and 210 generally defines the width of the dielectric spine to be formed between the fins. According to some embodiments, the distance d is between about 10 nm and about 20 nm.

Following the etching process used to form the fins, a dielectric fill 206 is formed around the base of each of the fins, according to an embodiment. Dielectric fill 206 may act as shallow trench isolation (STI) between adjacent semiconductor devices. In some embodiments, dielectric fill 206 includes silicon oxide, although other oxides or dielectrics may be used as well. Dielectric fill 206 may first be deposited to at least the same height as the fins, and then recessed back using any known controlled etching process to the final height shown. According to some embodiments, each of the fins includes a subfin portion 207 beneath an exposed portion of the fin and between dielectric fill 206. The subfin portions 207 may include the same material as semiconductor substrate 102 and may be an integral part of semiconductor substrate 102. Following the formation of dielectric fill 206, the exposed fins extending above a top surface of dielectric fill 206 may have a height between about 50 nm and about 200 nm. The width of the fins can be, for example, in the range of about 5 nm to about 15 nm, such as 6 nm wide.

It should be noted that the fin fabrication process described with reference to FIGS. 2A and 2B is just one example process for forming multilayer fins. Other processes may be used as well, such as the aforementioned aspect ratio trapping based process.

Figure 2C:
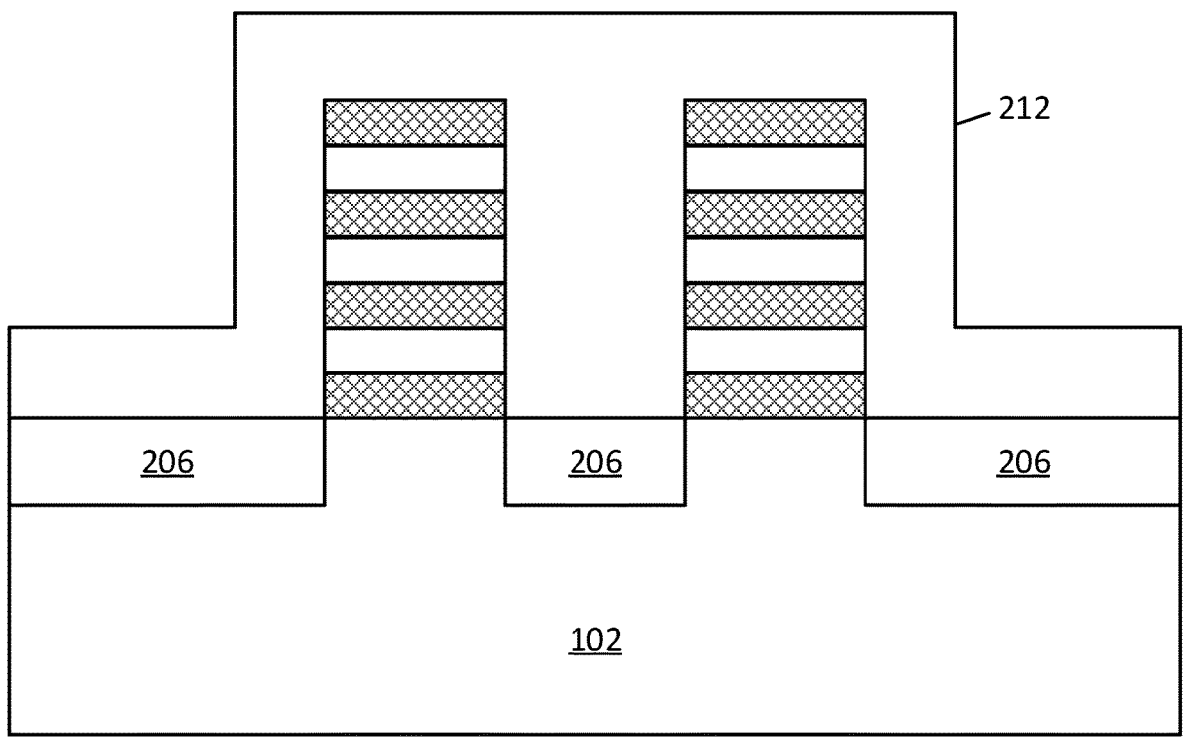

FIG. 2C illustrates a cross-sectional view of the structure shown in FIG. 2B following a blanket dielectric deposition, according to an embodiment of the present disclosure. A dielectric layer 212 is deposited over both fins using any known deposition technique such that dielectric layer 212 covers at least the tops of the fins and fills the region between the fins. According to some embodiments, dielectric layer 212 is the same material as dielectric fill 206. Dielectric layer 212 may be silicon oxide, to name one example. A thickness of dielectric layer 212 over the top surfaces of the fins generally defines the thickness of the dielectric overhang structures and may be between about 5 nm and about 20 nm.

Figure 2D:
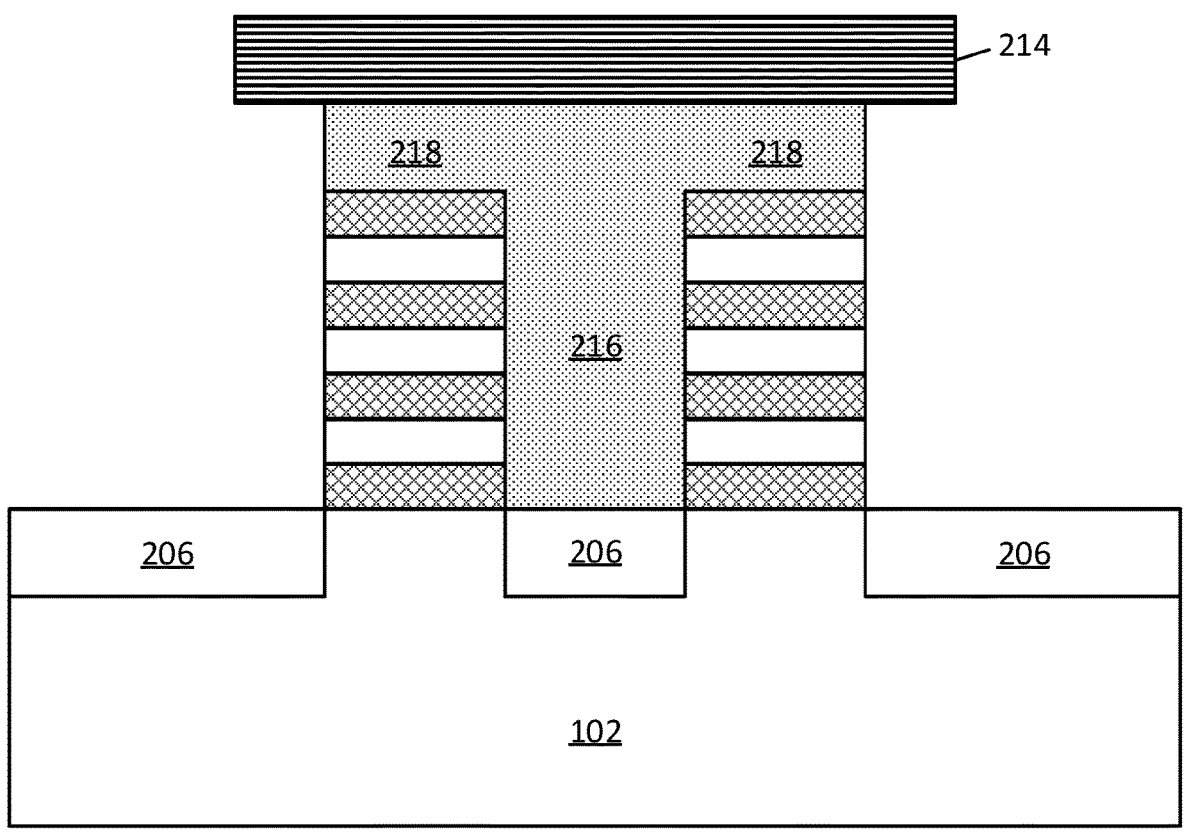

FIG. 2D illustrates a cross-sectional view of the structure shown in FIG. 2C following the masking and patterning of dielectric layer 212, according to an embodiment of the present disclosure. A protective cap layer 214 may be selectively formed over the portions of dielectric layer 212 that are above the fins. The presence of the fins causes a natural peak in the dielectric layer 212 as it forms over and around them. According to some embodiments, cap layer 214 may be deposited using a PVD technique, such as sputtering, to selectively deposit cap layer 214 on the peaks of dielectric layer 212. Cap layer 214 may be any suitable dielectric or semiconductor material that exhibits high etch selectivity to dielectric layer 212. In some examples, cap layer 214 is a metal nitride, such as titanium nitride, or may be silicon or silicon nitride.

Following the formation of cap layer 214, an isotropic etching process is performed to remove exposed portions of dielectric layer 212 and also to undercut portions of dielectric layer 212 beneath cap layer 214. Following the etching process, the remaining portions of dielectric layer 212 between the fins and over the fins define the dielectric spine 216 and overhang structures 218, according to an embodiment. Accordingly, in this example process, both dielectric spine 216 and overhang structures 218 are part of the same dielectric layer. Recall that the overhang structures can be thought of as a single continuous overhang structure 218. According to some embodiments, overhang structure 218 has a vertical thickness (in the y-axis) in the range of 5 nm to 20 nm. The lateral width (in the x-axis) of overhang structure 218 can vary from one embodiment to the next but in some cases is at least 1.5 times the lateral width of dielectric spine 216 (e.g., 2× wider, or 2.5× wider, or 3× wider).

Figure 2E:
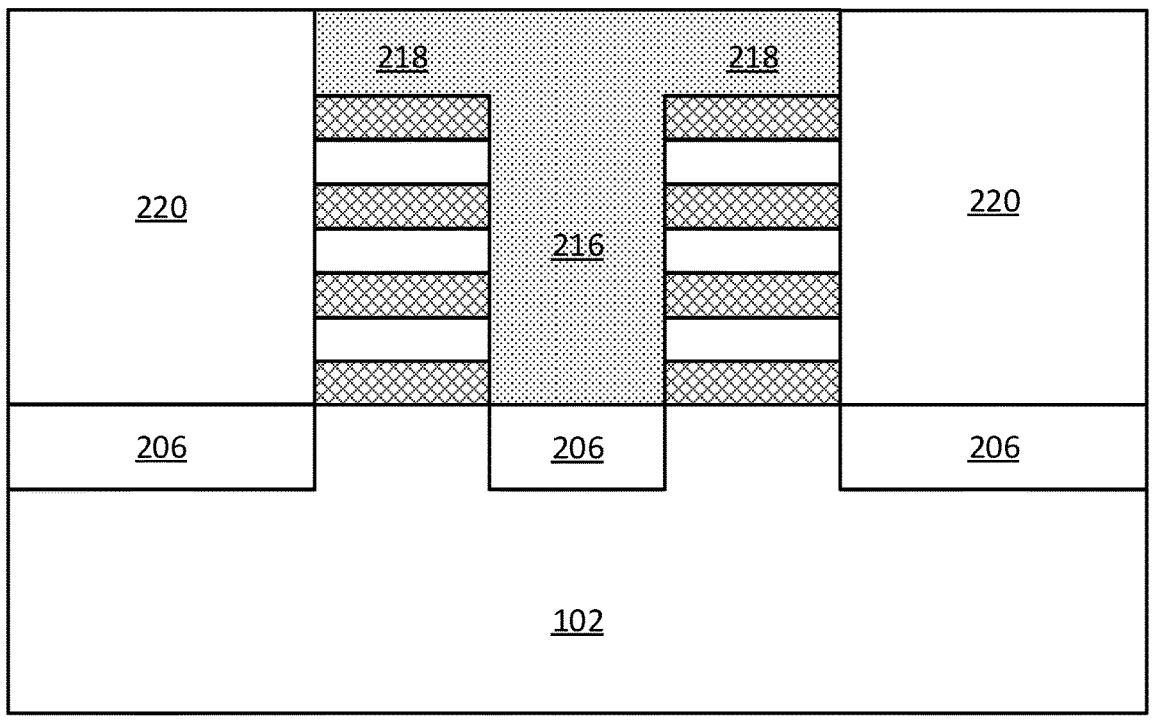

FIG. 2E illustrates a cross-sectional view of the structure shown in FIG. 2D following the removal of cap layer 214 and the formation of sacrificial gate 220, according to an embodiment of the present disclosure. Sacrificial gate 220 may run in an orthogonal direction to the length of the fins (which runs into and out of the page) and may include any material that can be safely removed later in the process without etching or otherwise damaging any portions of the fin. In some embodiments, sacrificial gate 220 includes polysilicon. Sacrificial gate 220 may be initially deposited over both fins and over dielectric spine 216 and overhang structures 218, and subsequently polished back until a top surface of sacrificial gate 220 is substantially planar with a top surface of overhang structures 218. Although not illustrated in these cross-sections, spacer structures are also formed on the sidewalls of sacrificial gate 220. Sacrificial gate 220 and the sidewall spacer structures are used to define the lengths of the fins while remaining portions of the fins not protected by sacrificial gate 220 and the sidewall spacers are removed. The source and drain regions for each of the semiconductor devices may be formed at the ends of both of the fins.

Figure 2F:
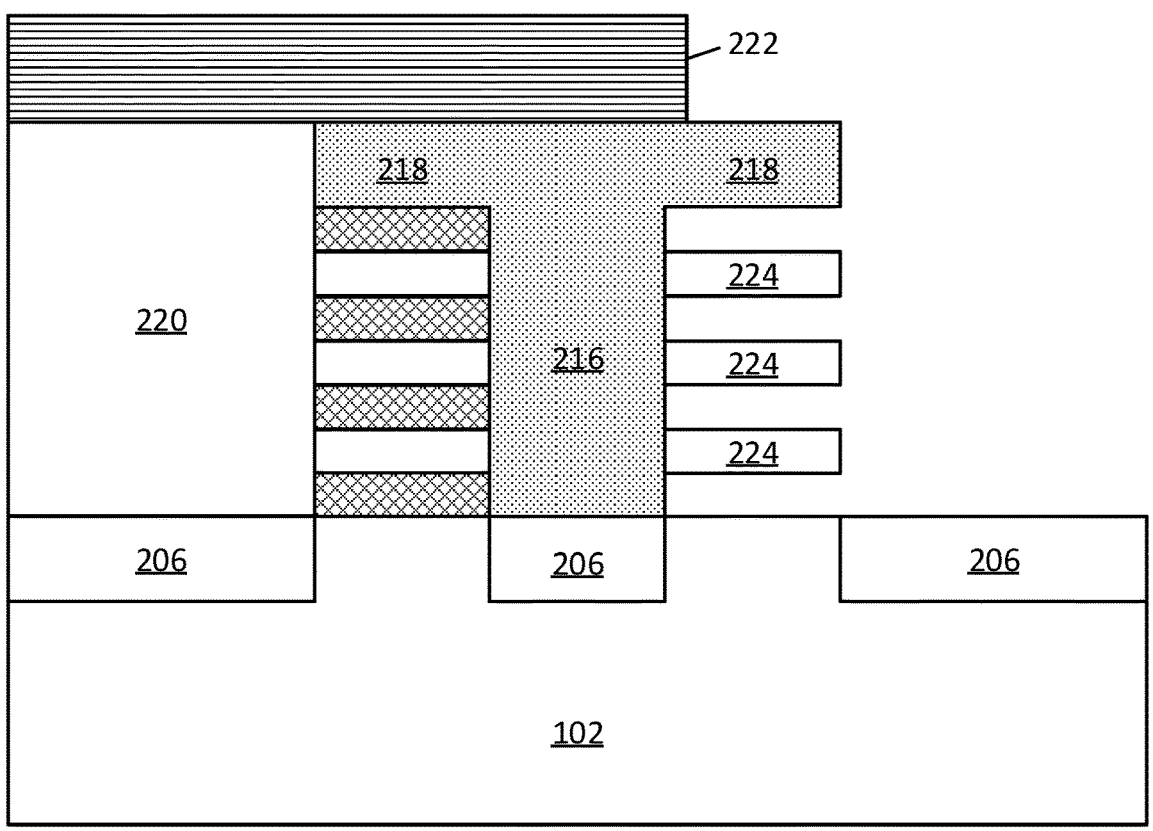

FIG. 2F illustrates a cross-sectional view of the structure shown in FIG. 2E following the removal of sacrificial layers 202 from one of the fins, according to an embodiment of the present disclosure. A mask layer 222 may be used to protect one fin while an isotropic etching process is used to remove sacrificial gate 220 adjacent to the other fin. Mask layer 222 may be a hard mask layer or a photoresist, such as a carbon hard mask (CHM) to name one example. It should be noted that the edge placement error (EPE) for mask 222 is greatly enhanced by the presence of overhang structures 218.

Sacrificial gate 220 may be removed using any wet or dry isotropic process thus exposing the alternating layer stack of the fin within the trench left behind after the removal of sacrificial gate 220. Once sacrificial gate structure 220 has been removed, sacrificial layers 202 may also be removed using a selective isotropic etching process that removes the material of sacrificial layers 202 but does not remove (or removes very little of) the semiconductor layers, resulting in one or more semiconductor nanoribbons 224. At this point, the semiconductor nanoribbons extend between source and drain regions into and out of the page.

Figure 2G:
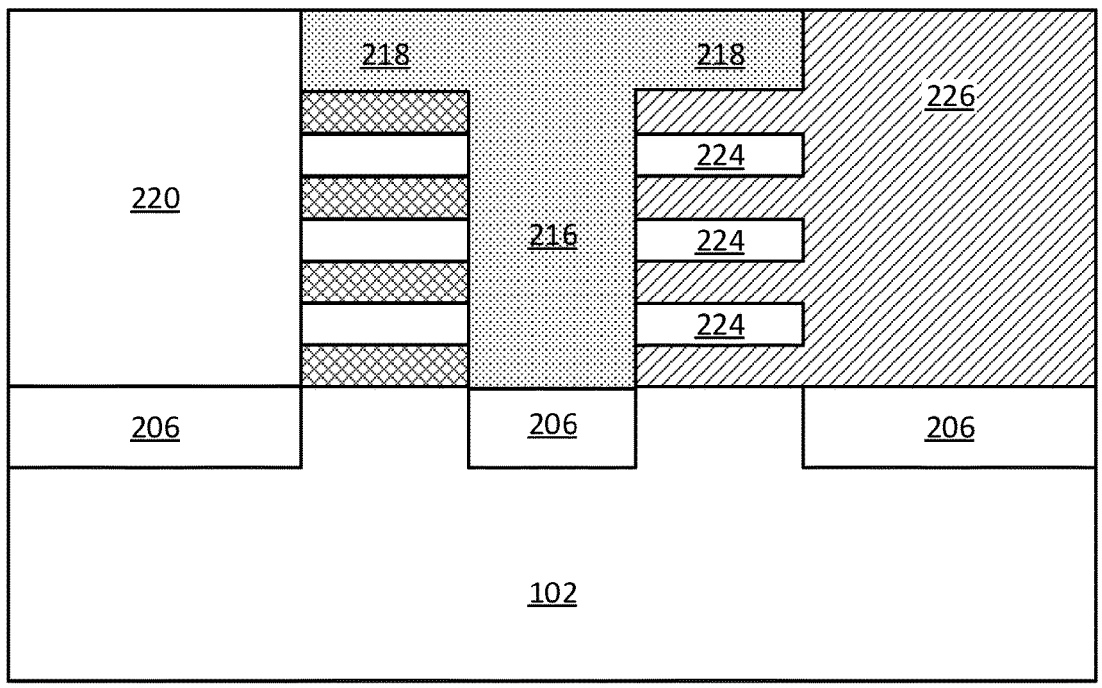

FIG. 2G illustrates a cross-sectional view of the structure shown in FIG. 2F following the formation of a first gate structure 226, according to an embodiment of the present disclosure. As noted above, first gate structure 226 includes a first gate dielectric and a first gate electrode.

The first gate dielectric may be conformally deposited around each of nanoribbons 224 using any suitable deposition process, such as thermal oxidation and/or ALD. The first gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the first gate dielectric is hafnium oxide with a thickness between about 1 nm and about 5 nm. In some embodiments, the first gate dielectric may include one or more silicates (e.g., titanium silicate, tungsten silicate, niobium silicate, and silicates of other transition metals). The first gate dielectric may be a multilayer structure, in some examples. For instance, the first gate dielectric may include a first layer on nanoribbons 224, and a second layer on the first layer. The first layer can be, for instance, an oxide of the semiconductor layers (e.g., silicon dioxide, provided by thermal oxidation or ALD) and the second layer can be a high-k dielectric material (e.g., hafnium oxide provided by ALD).

The first gate electrode may be deposited over the first gate dielectric and can be any standard or proprietary gate structure that may include any number of gate cuts. In some embodiments, the first gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The first gate electrode may include, for instance, one or more work function layers, resistance-reducing layers, and/or barrier layers. The work function layers can include, for example, p-type work function materials (e.g., titanium nitride) for PMOS gates, or n-type work function materials (e.g., titanium aluminum carbide) for NMOS gates.

Figure 2H:
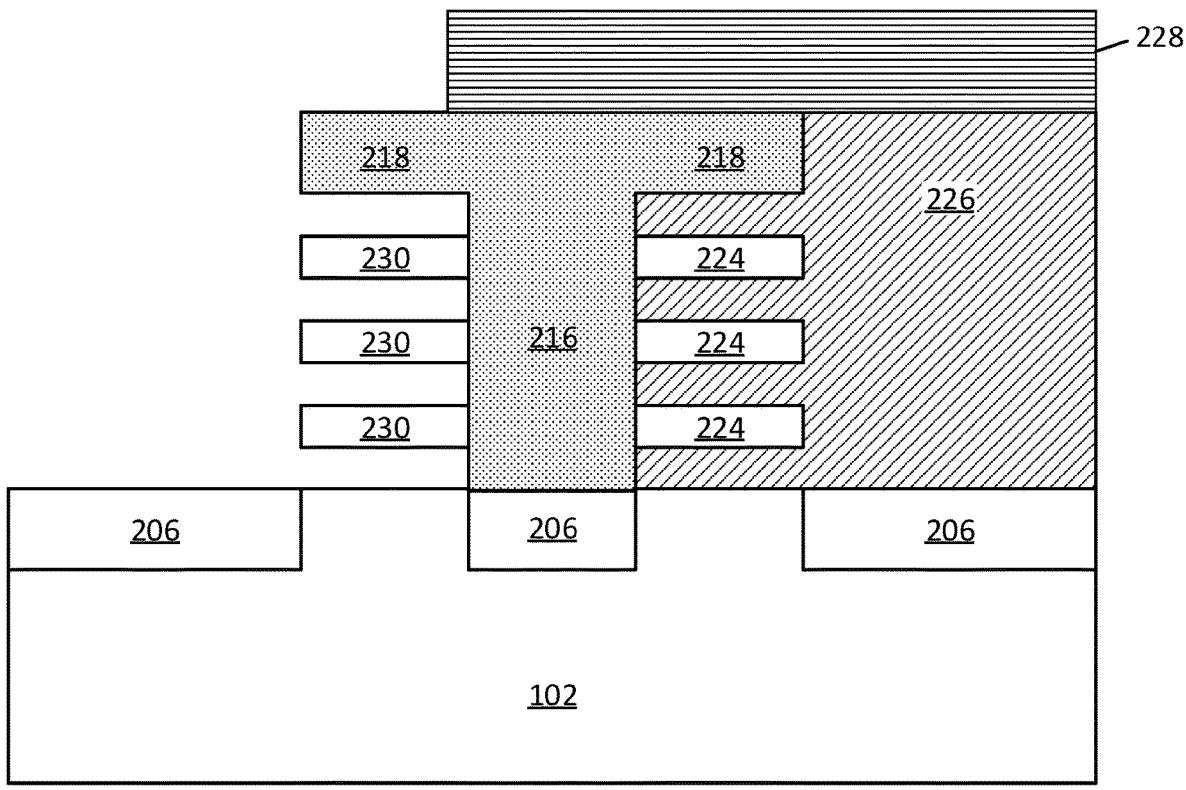

FIG. 2H illustrates a cross-sectional view of the structure shown in FIG. 2G following the removal of sacrificial layers 202 from the other of the fins, according to an embodiment of the present disclosure. A mask layer 228 may be used to protect one fin while an isotropic etching process is used to remove sacrificial gate 220 adjacent to the other fin. Mask layer 228 may be a hard mask layer or a photoresist, such as a carbon hard mask (CHM) to name one example. It should be noted that the edge placement error (EPE) for mask 228 is greatly enhanced by the presence of overhang structures 218. The process for removing sacrificial gate 220 and the sacrificial layers 202 is the same as described above with reference to FIG. 2F. Removing the sacrificial layers results in one or more semiconductor nanoribbons 230 that extend between source and drain regions into and out of the page.

Figure 2I:
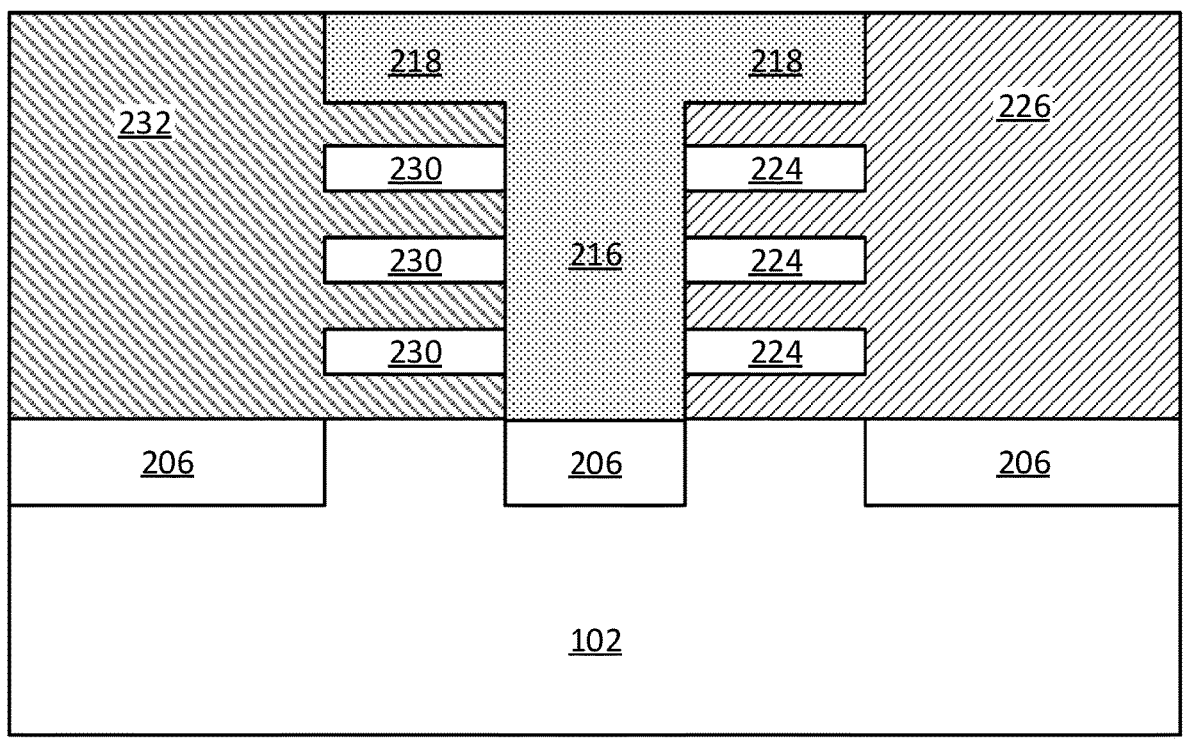

FIG. 2I illustrates a cross-sectional view of the structure shown in FIG. 2H following the formation of a second gate structure 232, according to an embodiment of the present disclosure. Second gate structure 232 may be formed in substantially the same manner as described above for first gate structure 226 and similarly includes a second gate dielectric and a second gate electrode.

The presence of overhang structures 218 allows for a greater alignment tolerance when forming both first gate structure 226 and second gate structure 232. In the example process of FIGS. 2A-2I, overhang structures 218 are an integral part of dielectric spine 216 and are thus the same dielectric material as dielectric spine 216. However, in some other embodiments, a different dielectric material may be used for overhang structures 218 as compared to dielectric spine 216.

Figure 3A:
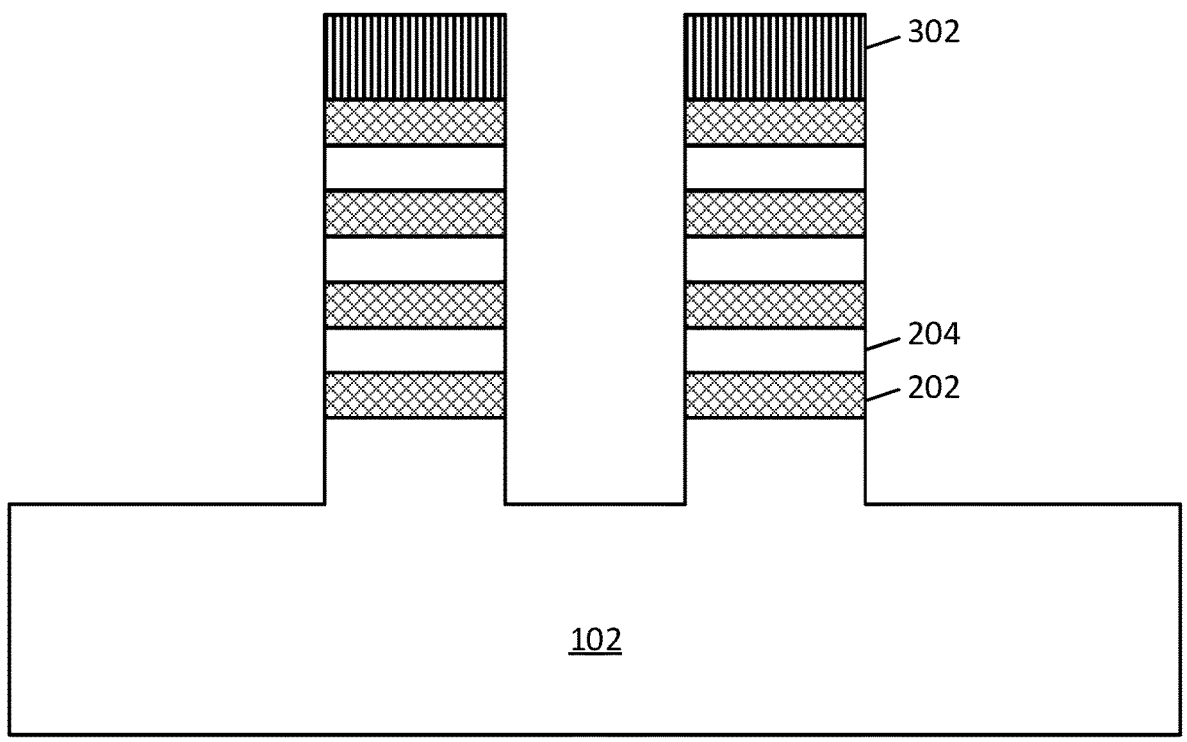
FIGS. 3A and 3B are cross-sectional views that collectively illustrate another example process for forming a semiconductor device having a dielectric overhang structure, in accordance with an embodiment of the present disclosure.
Figure 3B:
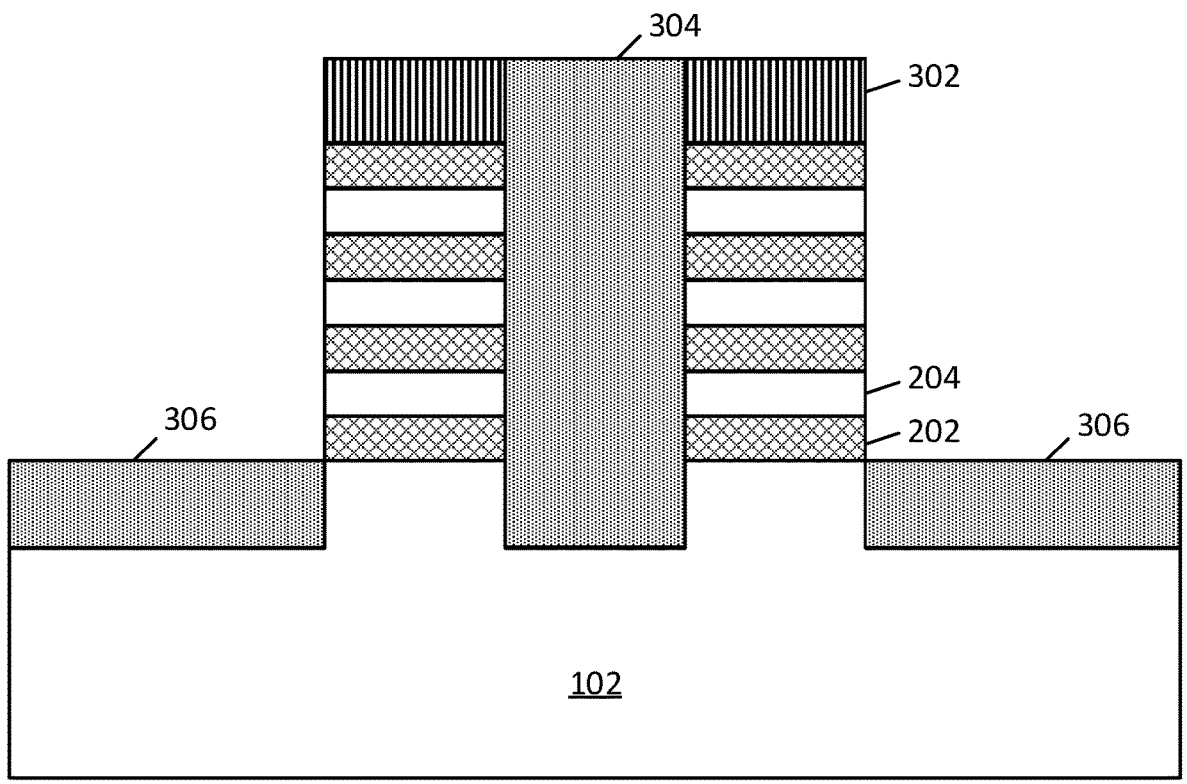

FIGS. 3A and 3B include cross-sectional views that collectively illustrate another example process for forming the dielectric overhang structure, in accordance with an embodiment of the present disclosure. According to some embodiments, the fabrication process depicted in FIG. 3A may pick up after the process illustrated in FIG. 2A where the fins have been patterned, but before the formation of any dielectric fill. Accordingly, each of the fins includes the alternating pattern of sacrificial layers 202 and semiconductor layers 204.

According to some embodiments, a helmet structure 302 is formed selectively over the top surfaces of the fins. Helmet structures 302 may be any suitable dielectric material such as silicon dioxide, aluminum oxide, silicon nitride, or silicon oxycarbonitride. In some embodiments, helmet structures 302 include a CHM material. Helmet structures 302 may be formed using a PVD process such as sputtering that selectively forms the helmet structures on the top surfaces of the fins. A short isotropic etch may be used to remove trace amounts of the deposited material from other surfaces. Helmet structures 302 may be deposited to a thickness of between about 5 nm and about 20 nm.

FIG. 3B illustrates a cross-sectional view of the structure shown in FIG. 3A following the formation of the dielectric spine, according to an embodiment of the present disclosure. A blanket deposition of a dielectric material may be formed over and around the fins and polished back such that the dielectric material forms dielectric spine 304 between the fins. In some other embodiments, the dielectric material is isotopically etched for a certain amount of time, which removes the dielectric material from all areas except between the fins where the etchant takes longer to penetrate. According to some embodiments, the dielectric material is further recessed around the fins (while protecting dielectric spine 304) to form STI structures 306. In some other embodiments, the dielectric material is completely removed around the fins (while protecting dielectric spine 304) and another dielectric material is deposited and recessed to form STI structures 306. According to some embodiments, helmet structures 302 provide dielectric overhang structures that are coupled to dielectric spine 304. Helmet structures 302 may be a different dielectric material compared to dielectric spine 304. All of the remaining fabrication operations are substantially similar to those illustrated in FIGS. 2E-2I.

Figure 4:
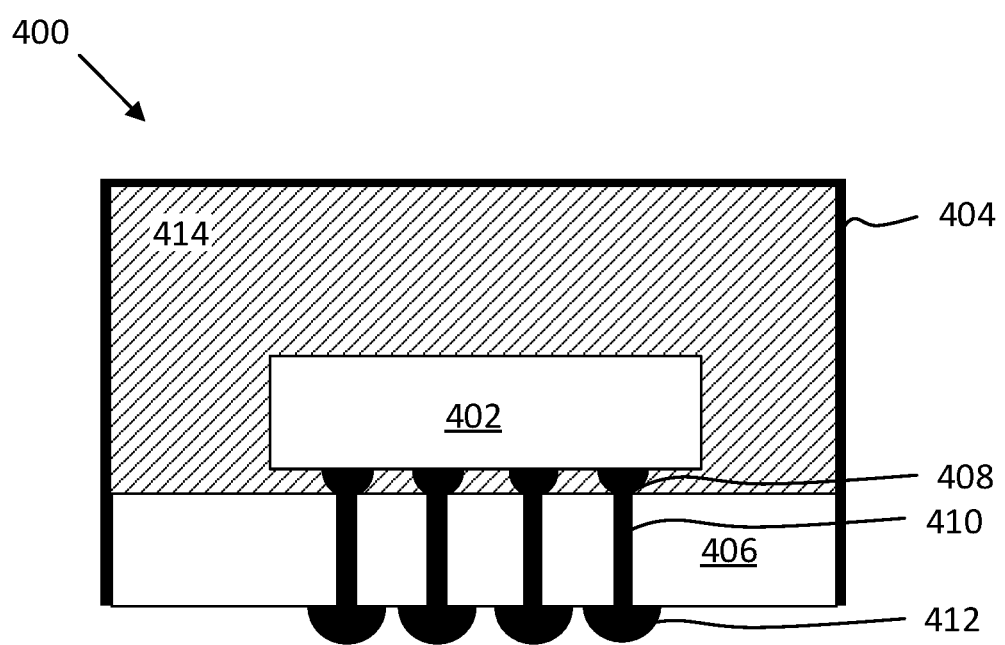
FIG. 4 illustrates a cross-section view of a chip package containing one or more semiconductor dies, in accordance with some embodiments of the present disclosure

FIG. 4 illustrates an example embodiment of a chip package 400, in accordance with an embodiment of the present disclosure. As can be seen, chip package 400 includes one or more dies 402. One or more dies 402 may include at least one integrated circuit having semiconductor devices, such as any of the semiconductor devices disclosed herein. One or more dies 402 may include any other circuitry used to interface with other devices formed on the dies, or other devices connected to chip package 400, in some example configurations.

As can be further seen, chip package 400 includes a housing 404 that is bonded to a package substrate 406. The housing 404 may be any standard or proprietary housing, and may provide, for example, electromagnetic shielding and environmental protection for the components of chip package 400. The one or more dies 402 may be conductively coupled to a package substrate 406 using connections 408, which may be implemented with any number of standard or proprietary connection mechanisms, such as solder bumps, ball grid array (BGA), pins, or wire bonds, to name a few examples. Package substrate 406 may be any standard or proprietary package substrate, but in some cases includes a dielectric material having conductive pathways (e.g., including conductive vias and lines) extending through the dielectric material between the faces of package substrate 406, or between different locations on each face. In some embodiments, package substrate 406 may have a thickness less than 1 millimeter (e.g., between 0.1 millimeters and 0.5 millimeters), although any number of package geometries can be used. Additional conductive contacts 412 may be disposed at an opposite face of package substrate 406 for conductively contacting, for instance, a printed circuit board (PCB). One or more vias 410 extend through a thickness of package substrate 406 to provide conductive pathways between one or more of connections 408 to one or more of contacts 412. Vias 410 are illustrated as single straight columns through package substrate 406 for ease of illustration, although other configurations can be used (e.g., damascene, dual damascene, through-silicon via, or an interconnect structure that meanders through the thickness of substrate 406 to contact one or more intermediate locations therein). In still other embodiments, vias 410 are fabricated by multiple smaller stacked vias, or are staggered at different locations across package substrate 406. In the illustrated embodiment, contacts 412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 412, to inhibit shorting.

In some embodiments, a mold material 414 may be disposed around the one or more dies 402 included within housing 404 (e.g., between dies 402 and package substrate 406 as an underfill material, as well as between dies 402 and housing 404 as an overfill material). Although the dimensions and qualities of the mold material 414 can vary from one embodiment to the next, in some embodiments, a thickness of mold material 414 is less than 1 millimeter. Example materials that may be used for mold material 414 include epoxy mold materials, as suitable. In some cases, the mold material 414 is thermally conductive, in addition to being electrically insulating.

Methodology

Figure 5:
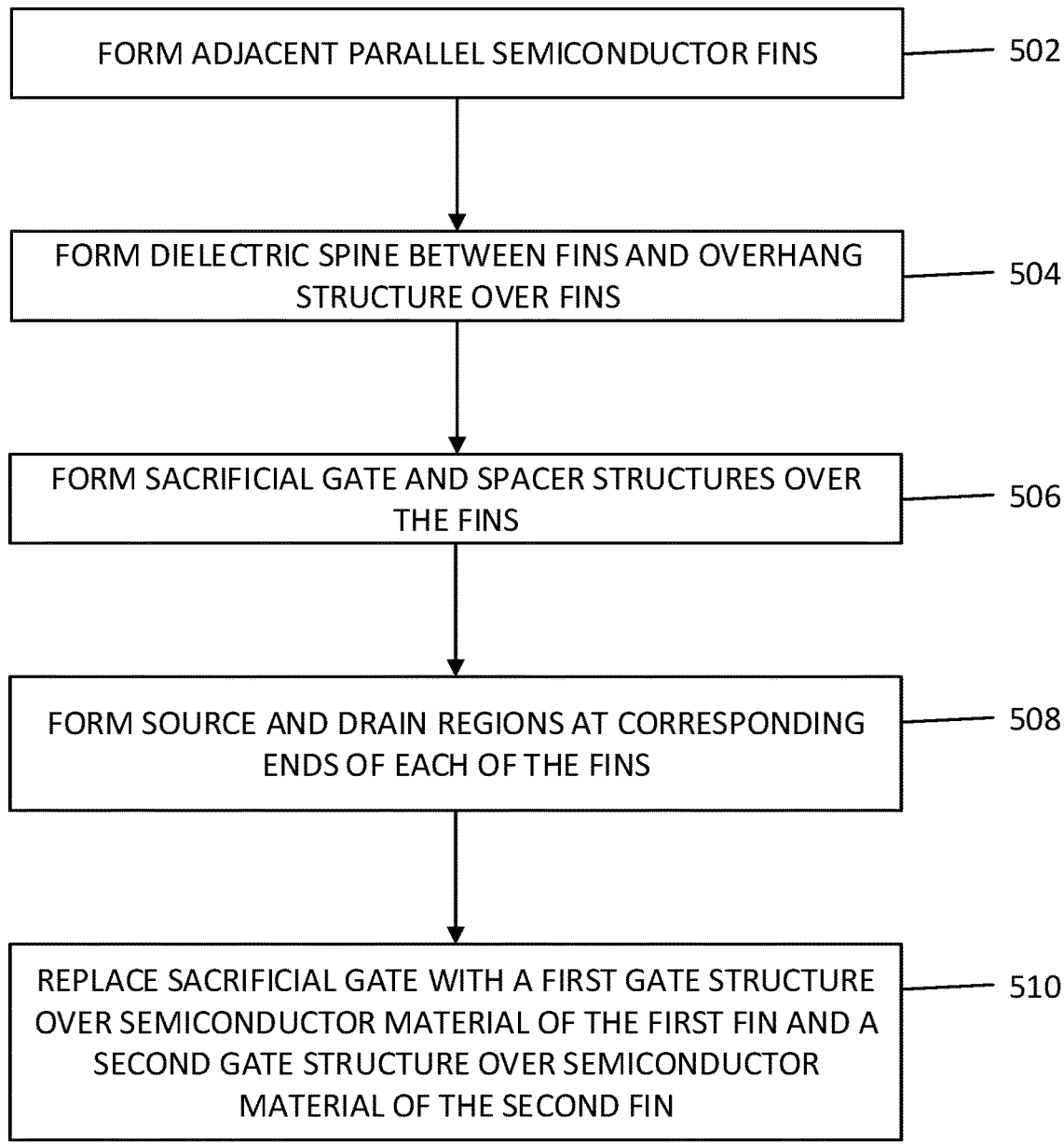
FIG. 5 is a flowchart of a fabrication process for a semiconductor device having a dielectric overhang structure, in accordance with an embodiment of the present disclosure.

FIG. 5 is a flow chart of a method 500 for forming at least a portion of an integrated circuit, according to an embodiment. Various operations of method 500 may be illustrated in FIGS. 2A-2I. However, the correlation of the various operations of method 500 to the specific components illustrated in the aforementioned figures is not intended to imply any structural and/or use limitations. Rather, the aforementioned figures provide one example embodiment of method 500. Other operations may be performed before, during, or after any of the operations of method 500. For example, method 500 does not explicitly describe many steps that are performed to form common transistor structures. Some of the operations of method 500 may be performed in a different order than the illustrated order.

Method 500 begins with operation 502 where adjacent parallel fins are formed. Each of the adjacent fins may include alternating sacrificial layers (e.g., comprising SiGe) and semiconductor layers (e.g., comprising Si, SiGe, Ge, InP, or GaAs). The thickness of each of the sacrificial layers and semiconductor layers may be between about 5 nm and about 20 nm or between about 5 nm and about 10 nm. Each of layers may be deposited using any known material deposition technique, such as CVD, PECVD, PVD, or ALD. Once all layers have been deposited over a substrate, the adjacent fins may be defined through the layer stack via an anisotropic etching process, such as RIE, using a patterned mask material to protect the fins from the etch. The total fin height may include the alternating material layers and a subfin portion formed from the substrate material. In some other embodiments, trenches are first formed in a dielectric material and the alternating material layers are formed within the trenches to form one or more multilayer fins. A distance between the adjacent parallel fins defines a width of the dielectric spine to be formed between the fins.

Method 500 continues with operation 504 where a dielectric spine is formed between the fins and dielectric overhang structures are formed over the fins. In some embodiments, the dielectric spine and dielectric overhang structures are formed from the same dielectric material. In other embodiments, the dielectric spine is formed from a first dielectric material and the overhang structures are formed from a second dielectric material different from the first material. As previously noted, the left-going and right-going overhang structures can be thought of as a single continuous overhang structure (such as the top portion of a T-shape).

In examples where the dielectric spine and the dielectric overhang structures are formed from the same material, a dielectric layer may be blanket deposited over and around the fins, including between the fins. The mask layer may be patterned to protect the dielectric layer over the fins while the exposed portions of the dielectric layer are removed using an isotropic etch. The remaining portion of the dielectric layer beneath the mask layer includes both the dielectric spine between the fins and the dielectric overhang structures over the fins.

In examples where the dielectric spine and the dielectric overhang structures are formed from different materials, dielectric helmet structures are formed over the fins using a sputtering process followed by a blanket deposition of another dielectric material. The blanket-deposited material can be removed from areas outside of the region between the fins by either polishing the material back or using an isotropic etch to remove the dielectric material from outside the spine region (as the etchant takes longer to penetrate between the fins).

Method 500 continues with operation 506 where a sacrificial gate and spacer structures are formed over the fins. The sacrificial gate may run in an orthogonal direction to the length of the fins and may include any material that can be safely removed later in the process without etching or otherwise damaging any portions of the fin. In some embodiments, the sacrificial gate includes polysilicon. The sacrificial gate may be initially deposited over both fins and over the dielectric spine and overhang structures, and subsequently polished back until a top surface of the sacrificial gate is substantially planar with a top surface of the overhang structures. The sidewall spacer structures may include any dielectric material and are used (along with the sacrificial gate) to define the lengths of the fins while remaining portions of the fins not protected by the sacrificial gate and the sidewall spacers are removed.

Method 500 continues with operation 508 where source and drain regions are formed at corresponding ends of each of the fins. According to some embodiments, the source and drain regions are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors.

Method 500 continues with operation 510 where the sacrificial gate is replaced with a first gate structure over the semiconductor material of the first fin and a second gate structure over the semiconductor material of the second fin. Each of the first gate structure and the second gate structure includes a gate dielectric and a gate electrode. The gate dielectric of each gate structure may be conformally deposited first around the semiconductor material of the corresponding fin using any suitable deposition process, such as ALD. The gate dielectrics may include any suitable dielectric (such as silicon dioxide, and/or a high-k dielectric material). According to some embodiments, the gate dielectrics include hafnium oxide with a thickness between about 1 nm and about 5 nm. In some embodiments, the gate dielectrics may include one or more silicates (e.g., titanium silicate, tungsten silicate, niobium silicate, and silicates of other transition metals). Either of the gate dielectrics may be a multilayer structure, in some examples.

The gate electrodes of each of gate structure may be deposited over the corresponding gate dielectric and can be any standard or proprietary conductive structure that may include any number of gate cuts. In some embodiments, the gate electrodes include doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrodes may include, for instance, one or more work function layers, resistance-reducing layers, and/or barrier layers. The work function layers can include, for example, p-type work function materials (e.g., titanium nitride) for PMOS gates, or n-type work function materials (e.g., titanium aluminum carbide) for NMOS gates.

Example System

Figure 6:
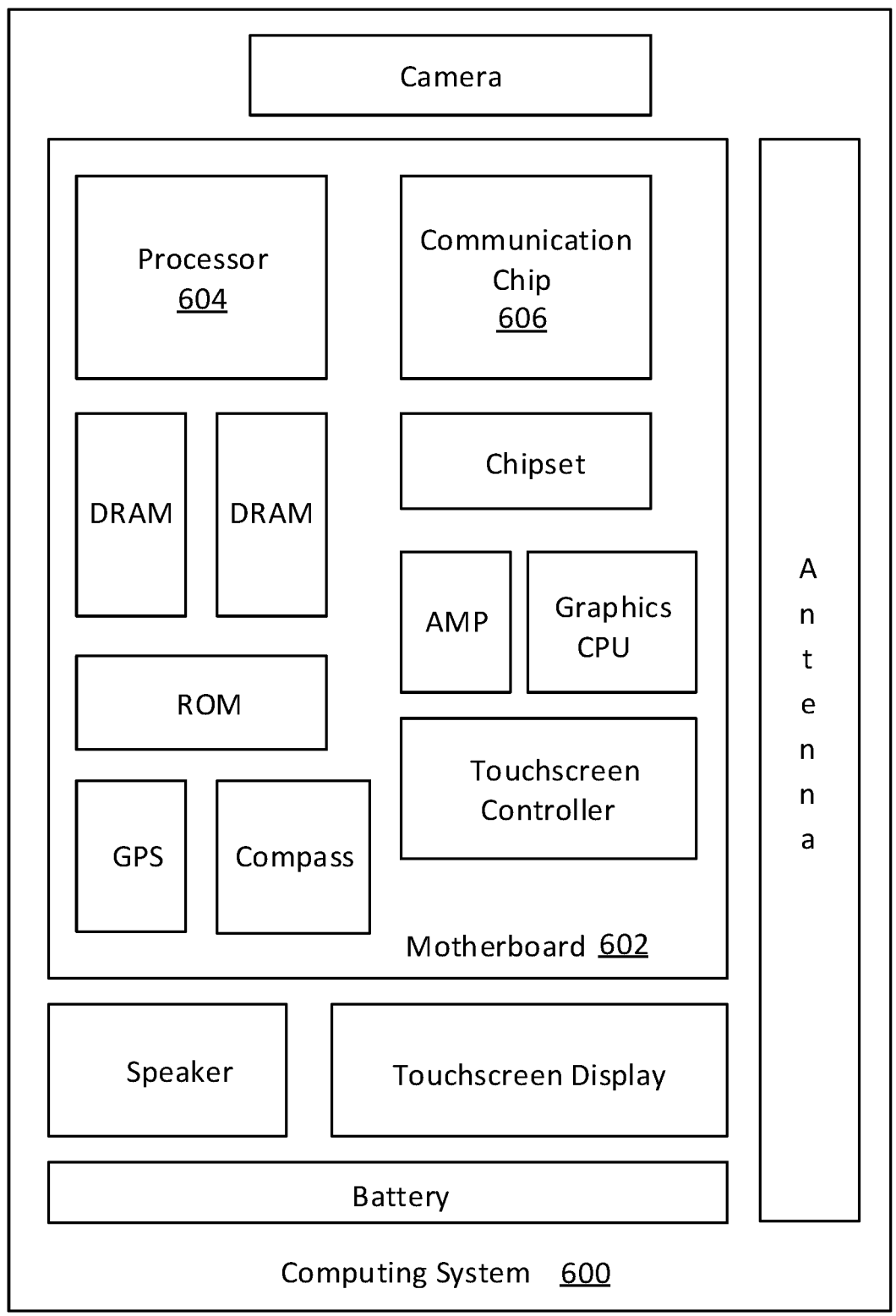
FIG. 6 illustrates a computing system including one or more integrated circuits, as variously described herein, in accordance with an embodiment of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board (PCB), whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., a module including an integrated circuit device having forksheet transistors with a dielectric overhang structure, as variously provided herein). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing system 600 includes an integrated circuit die packaged within the processor 604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more semiconductor devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 600 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device having a first semiconductor material extending in a first direction between a first source region and a first drain region, a second semiconductor device having a second semiconductor material extending in the first direction between a second source region and a second drain region, a dielectric spine between the first semiconductor material and the second semiconductor material, an overhang structure comprising a dielectric material, a first gate structure around the first semiconductor material, and a second gate structure around the second semiconductor material. The dielectric spine contacts both the first semiconductor material and the second semiconductor material and the overhang structure is at least partially over both the first semiconductor material and the second semiconductor material and either contacting or being an integral part of the dielectric spine.

Example 2 includes the subject matter of Example 1, wherein the first semiconductor material is a first fin comprising silicon or germanium or both, and the second semiconductor material is a second fin comprising silicon or germanium or both, the first fin orientated parallel to the second fin.

Example 3 includes the subject matter of Example 1, wherein the first semiconductor material comprises a first set of one or more semiconductor nanoribbons and the second semiconductor material comprises a second set of one or more semiconductor nanoribbons.

Example 4 includes the subject matter of Example 3, wherein the first set of one or more semiconductor nanoribbons and the second set of one or more semiconductor nanoribbons comprise germanium, silicon, or both.

Example 5 includes the subject matter of any one of Examples 1-4, wherein the first semiconductor material comprises n-type dopants and the second semiconductor material comprises p-type dopants.

Example 6 includes the subject matter of any one of Examples 1-5, wherein the dielectric spine includes silicon and oxygen, and the overhang structure is an integral part of the dielectric spine.

Example 7 includes the subject matter of any one of Examples 1-6, wherein the dielectric spine has a width extending between the first semiconductor material and the second semiconductor material of about 10 nm to about 20 nm.

Example 8 includes the subject matter of any one of Examples 1-7, wherein the first gate structure comprises a first work function metal and the second gate structure comprises a second work function metal elementally different from the first work function metal.

Example 9 includes the subject matter of Example 8, wherein a portion of the first work function metal and a portion of the second work function metal contact the overhang structure.

Example 10 includes the subject matter of any one of Examples 1-9, wherein the overhang structure has a vertical thickness between about 5 nm and about 20 nm, and a lateral width that is at least 1.5 times greater than a lateral width of the dielectric spine.

Example 11 includes the subject matter of any one of Examples 1-10, wherein the dielectric spine comprises a dielectric material that is different from the dielectric material of the overhang structure.

Example 12 is a memory chip or microprocessor that includes the integrated circuit of any one of Examples 1-11.

Example 13 is a printed circuit board that includes the integrated circuit of any one of Examples 1-11.

Example 14 is an electronic device that includes a chip package comprising one or more dies. At least one of the one or more dies includes a first semiconductor device having a first semiconductor material extending in a first direction between a first source region and a first drain region, a second semiconductor device having a second semiconductor material extending in the first direction between a second source region and a second drain region, a dielectric spine between the first semiconductor material and the second semiconductor material, an overhang structure comprising a dielectric material, a first gate structure around the first semiconductor material, and a second gate structure around the second semiconductor material. The dielectric spine contacts both the first semiconductor material and the second semiconductor material and the overhang structure is at least partially over both the first semiconductor material and the second semiconductor material and either contacting or being an integral part of the dielectric spine.

Example 15 includes the subject matter of Example 14, wherein the first semiconductor material is a first fin comprising silicon or germanium or both, and the second semiconductor material is a second fin comprising silicon or germanium or both, the first fin orientated parallel to the second fin.

Example 16 includes the subject matter of Example 14, wherein the first semiconductor material comprises a first plurality of semiconductor nanoribbons and the second semiconductor material comprises a second plurality of semiconductor nanoribbons.

Example 17 includes the subject matter of Example 16, wherein the first plurality of semiconductor nanoribbons and the second plurality of semiconductor nanoribbons comprise germanium, silicon, or both.

Example 18 includes the subject matter of any one of Examples 14-17, wherein the first semiconductor material comprises n-type dopants and the second semiconductor material comprises p-type dopants.

Example 19 includes the subject matter of any one of Examples 14-18, wherein the dielectric spine is silicon oxide and the overhang structure is an integral part of the dielectric spine.

Example 20 includes the subject matter of any one of Examples 14-19, wherein the dielectric spine has a width extending between the first semiconductor material and the second semiconductor material of about 10 nm to about 20 nm.

Example 21 includes the subject matter of any one of Examples 14-20, wherein the first gate structure comprises a first work function metal and the second gate structure comprises a second work function metal different from the first work function metal.

Example 22 includes the subject matter of Example 21, wherein a portion of the first work function metal and a portion of the second work function metal contact the overhang structure.

Example 23 includes the subject matter of any one of Examples 14-22, wherein the overhang structure has a thickness between about 5 nm and about 20 nm, and a lateral width that is at least 1.5 times greater than a lateral width of the dielectric spine.

Example 24 includes the subject matter of any one of Examples 14-23, wherein the dielectric spine comprises a dielectric material that is different from the dielectric material of the overhang structure.

Example 25 includes the subject matter of any one of Examples 14-24, further comprising a printed circuit board, wherein the chip package is attached to the printed circuit board.

Example 26 is a method of forming an integrated circuit. The method includes forming a first fin comprising first semiconductor material and a second fin comprising second semiconductor material, wherein the first fin and the second fin extend parallel to one another; and forming a dielectric structure between the first fin and the second fin. Forming the dielectric structure includes forming a dielectric spine between the first fin and the second fin, such that the dielectric spine contacts both the first fin and the second fin, and forming an overhang structure at least partially over both the first fin and the second fin, the overhang structure either contacting or being an integral part of the dielectric spine. The method further includes forming a sacrificial gate over the first fin and the second fin; forming spacer structures on sidewalls of the sacrificial gate; forming source and drain regions at ends of both the first fin and the second fin; removing the sacrificial gate; forming a first gate structure over the first semiconductor material; and forming a second gate structure over the second semiconductor material.

Example 27 includes the subject matter of Example 26, wherein forming the dielectric structure comprises: forming a dielectric material over and between both the first fin and the second fin; forming a cap layer over the dielectric material and over at least the first fin and the second fin; removing portions of the dielectric material that are not protected under the cap layer; and removing the cap layer.

Example 28 includes the subject matter of Example 27, wherein the dielectric material comprises silicon oxide, and the cap layer comprises a metal nitride.

Example 29 includes the subject matter of Example 26, wherein forming the dielectric structure comprises: forming helmet structures over the first fin and the second fin; forming a dielectric material over and between the first fin and the second fin; and removing portions of the dielectric material such that the dielectric material remains between the first fin and the second fin.

Example 30 includes the subject matter of Example 29, wherein the dielectric material is a first dielectric material and the helmet structures comprise a second dielectric material different from the first dielectric material.

Example 31 includes the subject matter of any one of Examples 26-30, wherein forming the first gate structure comprises forming a first work function metal around the first semiconductor material and forming the second gate structure comprises forming a second work function metal around the second semiconductor material, the second work function metal being different from the first work function metal.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a first semiconductor device having a first semiconductor material extending in a first direction between a first source region and a first drain region;
   a second semiconductor device having a second semiconductor material extending in the first direction between a second source region and a second drain region;
   a dielectric spine between the first semiconductor material and the second semiconductor material, such that the dielectric spine contacts both the first semiconductor material and the second semiconductor material;
   an overhang structure comprising a dielectric material that is an integral part of the dielectric spine, the overhang structure being over an entire width of both the first semiconductor material and the second semiconductor material along a second direction orthogonal to the first direction;
   a first gate structure around the first semiconductor material;
   a second gate structure around the second semiconductor material;
   wherein the first gate structure comprises a first work function metal and the second gate structure comprises a second work function metal elementally different from the first work function metal; and wherein at least a portion of the first work function metal and at least a portion of the second work function metal contact the overhang structure.

2. The integrated circuit of claim 1, wherein the first semiconductor material comprises a first set of one or more semiconductor nanoribbons and the second semiconductor material comprises a second set of one or more semiconductor nanoribbons.

3. The integrated circuit of claim 1, wherein the first semiconductor material comprises n-type dopants and the second semiconductor material comprises p-type dopants.

4. The integrated circuit of claim 1, wherein the dielectric spine and the overhang structure includes silicon and oxygen.

5. The integrated circuit of claim 1, wherein the dielectric spine has a width extending between the first semiconductor material and the second semiconductor material of about 10 nm to about 20 nm.

6. A printed circuit board comprising the integrated circuit of claim 1.

7. An electronic device, comprising:
a chip package comprising one or more dies, at least one of the one or more dies comprising
a first semiconductor device having a first semiconductor material extending in a first direction between a first source region and a first drain region;
a second semiconductor device having a second semiconductor material extending in the first direction between a second source region and a second drain region;
a dielectric spine between the first semiconductor material and the second semiconductor material, such that the dielectric spine contacts both the first semiconductor material and the second semiconductor material;
an overhang structure comprising a dielectric material that is an integral part of the dielectric spine, the overhang structure being over an entire width of both the first semiconductor material and the second semiconductor material along a second direction orthogonal to the first direction;
a first gate structure around the first semiconductor material;
a second gate structure around the second semiconductor material;
wherein the first gate structure comprises a first work function metal and the second gate structure comprises a second work function metal elementally different from the first work function metal; and
wherein at least a portion of the first work function metal and at least a portion of the second work function metal contact the overhang structure.

8. The electronic device of claim 7, wherein the first semiconductor material comprises a first plurality of semiconductor nanoribbons and the second semiconductor material comprises a second plurality of semiconductor nanoribbons.

9. The electronic device of claim 7, wherein the first semiconductor material comprises n-type dopants and the second semiconductor material comprises p-type dopants.

10. The electronic device of claim 7, wherein the dielectric spine and the overhang structure includes silicon and oxygen.

11. The electronic device of claim 7, wherein the dielectric spine has a width extending between the first semiconductor material and the second semiconductor material of about 10 nm to about 20 nm.

12. The electronic device of claim 7, wherein the overhang structure has a thickness between about 5 nm and about 20 nm, and a lateral width that is at least 1.5 times greater than a lateral width of the dielectric spine.

13. The electronic device of claim 7, further comprising a printed circuit board, wherein the chip package is attached to the printed circuit board.

14. An integrated circuit comprising:
a first semiconductor device having a first semiconductor material extending in a first direction from a first source or drain region;
a second semiconductor device having a second semiconductor material extending in the first direction from a second source or drain region;
a dielectric spine between the first semiconductor material and the second semiconductor material, such that the dielectric spine extends an entire distance along a second direction, orthogonal to the first direction, between the first semiconductor material and the second semiconductor material;
an overhang structure comprising a dielectric material, the overhang structure being over an entire width of both the first semiconductor material and the second semiconductor material along a second direction orthogonal to the first direction;
a first gate structure around the first semiconductor material;
a second gate structure around the second semiconductor material;
wherein the first gate structure comprises a first work function metal and the second gate structure comprises a second work function metal elementally different from the first work function metal; and
wherein at least a portion of the first work function metal and at least a portion of the second work function metal contact the overhang structure.

15. The integrated circuit of claim 14, wherein the first semiconductor material comprises a first set of one or more semiconductor nanoribbons and the second semiconductor material comprises a second set of one or more semiconductor nanoribbons.

\* \* \* \* \*